(12) United States Patent
Tanaka et al.

(10) Patent No.: US 10,355,660 B2
(45) Date of Patent: Jul. 16, 2019

(54) ELECTRONIC COMPONENT

(71) Applicant: Murata Manufacturing Co., Ltd., Nagaokakyo-shi, Kyoto-fu (JP)

(72) Inventors: Akira Tanaka, Nagaokakyo (JP); Naoshi Ishimaru, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/617,063

(22) Filed: Jun. 8, 2017

(65) Prior Publication Data

US 2017/0272047 A1 Sep. 21, 2017

Related U.S. Application Data

(63) Continuation of application No. PCT/JP2015/072479, filed on Aug. 7, 2015.

(30) Foreign Application Priority Data

Dec. 10, 2014 (JP) .................................. 2014-250206

(51) Int. Cl.
*H03H 7/01* (2006.01)
*H03H 7/09* (2006.01)
(Continued)

(52) U.S. Cl.
CPC ....... *H03H 7/0115* (2013.01); *H01F 17/0013* (2013.01); *H01P 1/203* (2013.01);
(Continued)

(58) Field of Classification Search
CPC . H03H 7/09; H03H 7/0115; H03H 2001/0085
(Continued)

(56) References Cited

U.S. PATENT DOCUMENTS

2011/0074526 A1* 3/2011 Taniguchi ........... H01P 1/20345
333/185
2012/0319801 A1* 12/2012 Taniguchi ............ H03H 7/0115
333/185
(Continued)

FOREIGN PATENT DOCUMENTS

EP 2 009 787 A1 12/2008
JP 2014-057277 A 3/2014
(Continued)

OTHER PUBLICATIONS

Official Communication issued in International Patent Application No. PCT/JP2015/072479, dated Sep. 15, 2015.

*Primary Examiner* — Rakesh B Patel
(74) *Attorney, Agent, or Firm* — Keating & Bennett, LLP

(57) ABSTRACT

An electronic component includes two or more first parallel resonators arranged in an orthogonal direction orthogonal or substantially orthogonal to a lamination direction, each first LC parallel resonator including a first inductor and a first capacitor, two second LC parallel resonators surrounding the two or more first LC parallel resonators from both sides in the orthogonal direction, each second LC parallel resonator including a second inductor and a second capacitor, a second capacitor connected to one end of the two second LC parallel resonators, and a first connecting conductor that connects two of the first LC parallel resonators that are not adjacent in the orthogonal direction, or connects one of the first LC parallel resonators and one of the second LC parallel resonators that are not adjacent in the orthogonal direction.

15 Claims, 9 Drawing Sheets

(51) Int. Cl.
*H01P 1/203* (2006.01)
*H01P 1/205* (2006.01)
*H03H 1/00* (2006.01)
*H01F 17/00* (2006.01)

(52) U.S. Cl.
CPC .......... *H01P 1/205* (2013.01); *H01P 1/20327* (2013.01); *H03H 1/00* (2013.01); *H03H 7/09* (2013.01); *H03H 7/1775* (2013.01); *H01F 2017/0026* (2013.01); *H03H 2001/0085* (2013.01)

(58) Field of Classification Search
USPC .................................................. 333/175, 185
See application file for complete search history.

(56) References Cited

U.S. PATENT DOCUMENTS

| | | |
|---|---|---|
| 2013/0229241 A1 | 9/2013 | Imamura |
| 2014/0077895 A1 | 3/2014 | Imamura |
| 2014/0145798 A1 | 5/2014 | Masuda |
| 2015/0061791 A1* | 3/2015 | Imamura .................. H03H 7/09 333/185 |

FOREIGN PATENT DOCUMENTS

| | | |
|---|---|---|
| WO | 2007/119356 A1 | 10/2007 |
| WO | 2012/066946 A1 | 5/2012 |
| WO | 2012/077498 A1 | 6/2012 |

* cited by examiner

ELECTRONIC COMPONENT

CROSS REFERENCE TO RELATED APPLICATIONS

This application claims the benefit of priority to Japanese Patent Application No. 2014-250206 filed on Dec. 10, 2014 and is a Continuation Application of PCT Application No. PCT/JP2015/072479 filed on Aug. 7, 2015. The entire contents of each application are hereby incorporated herein by reference.

BACKGROUND OF THE INVENTION

1. Field of the Invention

The present invention relates to electronic components, and particularly relates to an electronic component including a plurality of LC parallel resonators.

2. Description of the Related Art

The laminated band pass filter disclosed in International Publication No. WO 2007/119356 (particularly FIGS. 46 and 47) is known as an example of a past invention regarding an electronic component. This laminated band pass filter includes four LC parallel resonators. The LC parallel resonators are arranged in a row in a left-right direction and are magnetically coupled to each other. The laminated band pass filter functions as a band pass filter.

According to a variation of the laminated band pass filter, a capacitor is added, the capacitor being connected between the two LC parallel resonators provided on both ends. This makes it possible to adjust the frequency of attenuation poles.

Incidentally, it has been difficult to achieve desired bandpass characteristics with the laminated band pass filter disclosed in International Publication No. WO 2007/119356. To be more specific, adding a capacitor to the laminated band pass filter changes the frequencies of all of the attenuation poles. It is thus difficult to achieve desired bandpass characteristics with the laminated band pass filter.

SUMMARY OF THE INVENTION

Accordingly, preferred embodiments of the present invention provide electronic components that achieve desired bandpass characteristics.

An electronic component according to a preferred embodiment of the present invention includes a multilayer body including a plurality of insulation layers laminated in a lamination direction; two or more first LC parallel resonators arranged in an orthogonal direction orthogonal or substantially orthogonal to the lamination direction, each first LC parallel resonator including a first inductor and a first capacitor; two second LC parallel resonators disposed so as to enclose the two or more first LC parallel resonators from both sides in the orthogonal direction, each second LC parallel resonator including a second inductor and a second capacitor; a second capacitor connected to one end of the two second LC parallel resonators; and a first connecting conductor that connects two of the first LC parallel resonators that are not adjacent in the orthogonal direction, or connects one of the first LC parallel resonators and one of the second LC parallel resonators that are not adjacent in the orthogonal direction. Resonators of the two or more first LC parallel resonators and the two second LC parallel resonators adjacent in the orthogonal direction magnetically couple with each other to define a band pass filter.

According to various preferred embodiments of the present invention, desired bandpass characteristics are achieved easily.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is an exploded perspective view of the electronic component 10a.

DETAILED DESCRIPTION OF THE PREFERRED EMBODIMENTS

First Preferred Embodiment

Figure 1:
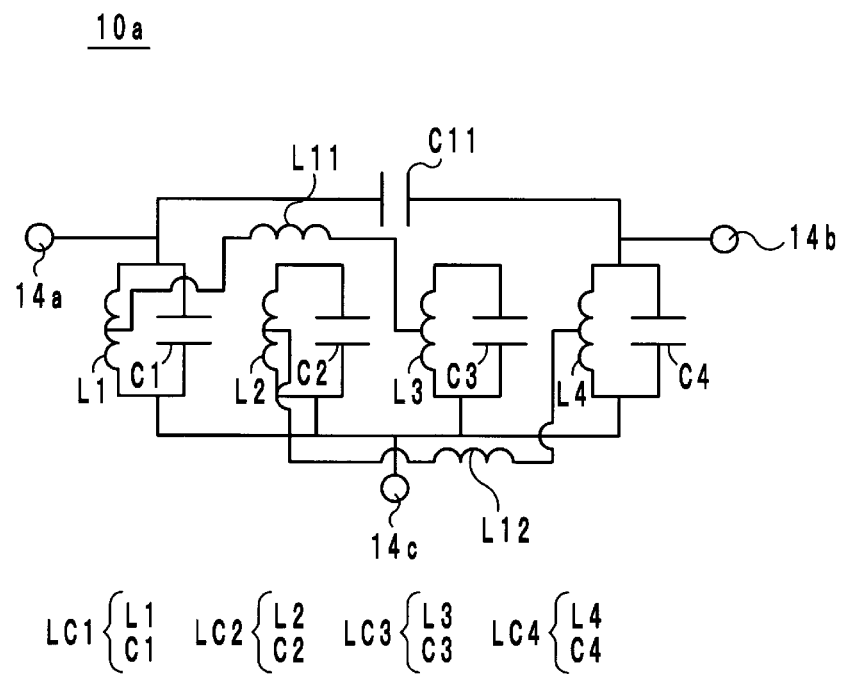
FIG. 1 is an equivalent circuit diagram illustrating an electronic component 10a according to a first preferred embodiment of the present invention.

An electronic component according to a first preferred embodiment of the present invention will be described hereinafter with reference to the drawings. FIG. 1 is an equivalent circuit diagram illustrating an electronic component 10a according to the first preferred embodiment.

First, an equivalent circuit of the electronic component 10a will be described with reference to the drawings. As illustrated in FIG. 1, the electronic component 10a includes, as an equivalent circuit configuration, inductors L1 to L4, L11, and L12, capacitors C1 to C4 and C11, and outer electrodes 14a to 14c, and is a band pass filter that allows high-frequency signals in a predetermined band to pass.

The outer electrodes 14a and 14b are input/output terminals that input/output a high-frequency signal. The outer electrode 14c is a ground terminal that is grounded.

The inductor L1 (an example of a second inductor) and the capacitor C1 (an example of a second capacitor) are connected to each other in parallel, and define an LC parallel resonator LC1 (an example of a second LC parallel resonator). A resonant frequency of the LC parallel resonator LC1 is f1. The inductor L2 (an example of a first inductor) and the capacitor C2 (an example of a first capacitor) are connected to each other in parallel, and define an LC parallel resonator LC2 (an example of a first LC parallel resonator). A resonant frequency of the LC parallel resonator LC2 is f2. The inductor L3 (an example of a first inductor) and the capacitor C3 (an example of a first capacitor) are connected to each other in parallel, and define an LC parallel resonator LC3 (an example of a first LC parallel resonator). A resonant frequency of the LC parallel resonator LC3 is f3. The inductor L4 (an example of a second inductor) and the capacitor C4 (an example of a second capacitor) are connected to each other in parallel, and define an LC parallel resonator LC4 (an example of a second LC parallel resonator). A resonant frequency of the LC parallel resonator LC4 is f4.

One end of the LC parallel resonator LC1 is connected to the outer electrode 14a. One end of the LC parallel resonator LC4 is connected to the outer electrode 14b. Furthermore, the LC parallel resonators LC1 to LC4 are arranged in that order between the outer electrode 14a and the outer electrode 14b. With the LC parallel resonators LC1 to LC4, adjacent resonators magnetically couple with each other, and thus, the LC parallel resonators LC1 to LC4 define a band pass filter. Other ends of the LC parallel resonators LC1 to LC4 are connected to the outer electrode 14c.

The capacitor C11 is connected between the outer electrode 14a and the outer electrode 14b, and thus is connected between one end of the LC parallel resonator LC1 and one end of the LC parallel resonator LC4.

The inductor L11 connects the inductor L1 (the LC parallel resonator LC1) and the inductor L3 (the LC parallel resonator LC3), which are not adjacent to each other. The inductor L12 connects the inductor L2 (the LC parallel resonator LC2) and the inductor L4 (the LC parallel resonator LC4), which are not adjacent to each other.

The electronic component 10a defines a band pass filter that allows high-frequency signals at frequencies near f1 to f4 to pass from the outer electrode 14a to the outer electrode 14b. To be more specific, impedance values of the LC parallel resonators LC1 to LC4 are at a maximum when high-frequency signals near f1 to f4 are inputted from the outer electrode 14a. As such, high-frequency signals at frequencies near f1 to f4 cannot pass through the LC parallel resonators LC1 to LC4 and are thus not outputted from the outer electrode 14c. As a result, high-frequency signals at frequencies near f1 to f4 are outputted from the outer electrode 14b. Meanwhile, high-frequency signals not at frequencies near f1 to f4 pass through the LC parallel resonators LC1 to LC4 and are outputted from the outer electrode 14c.

Figure 2:
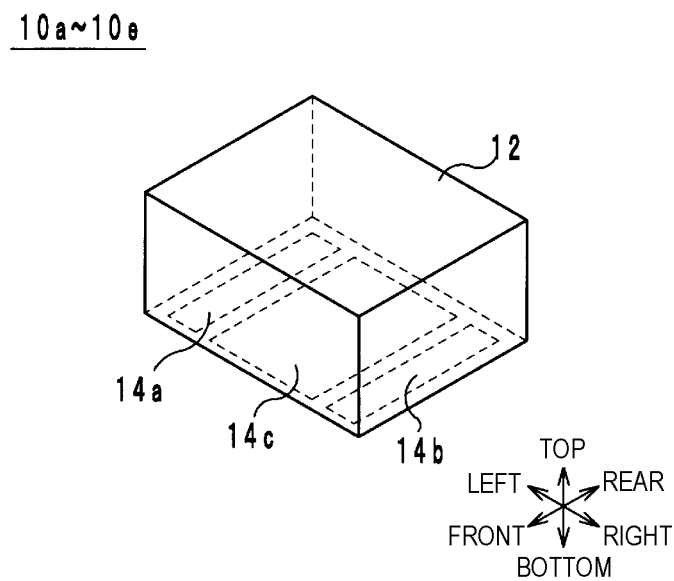
FIG. 2 is an external perspective view of electronic components 10a to 10e.
Figure 3A:
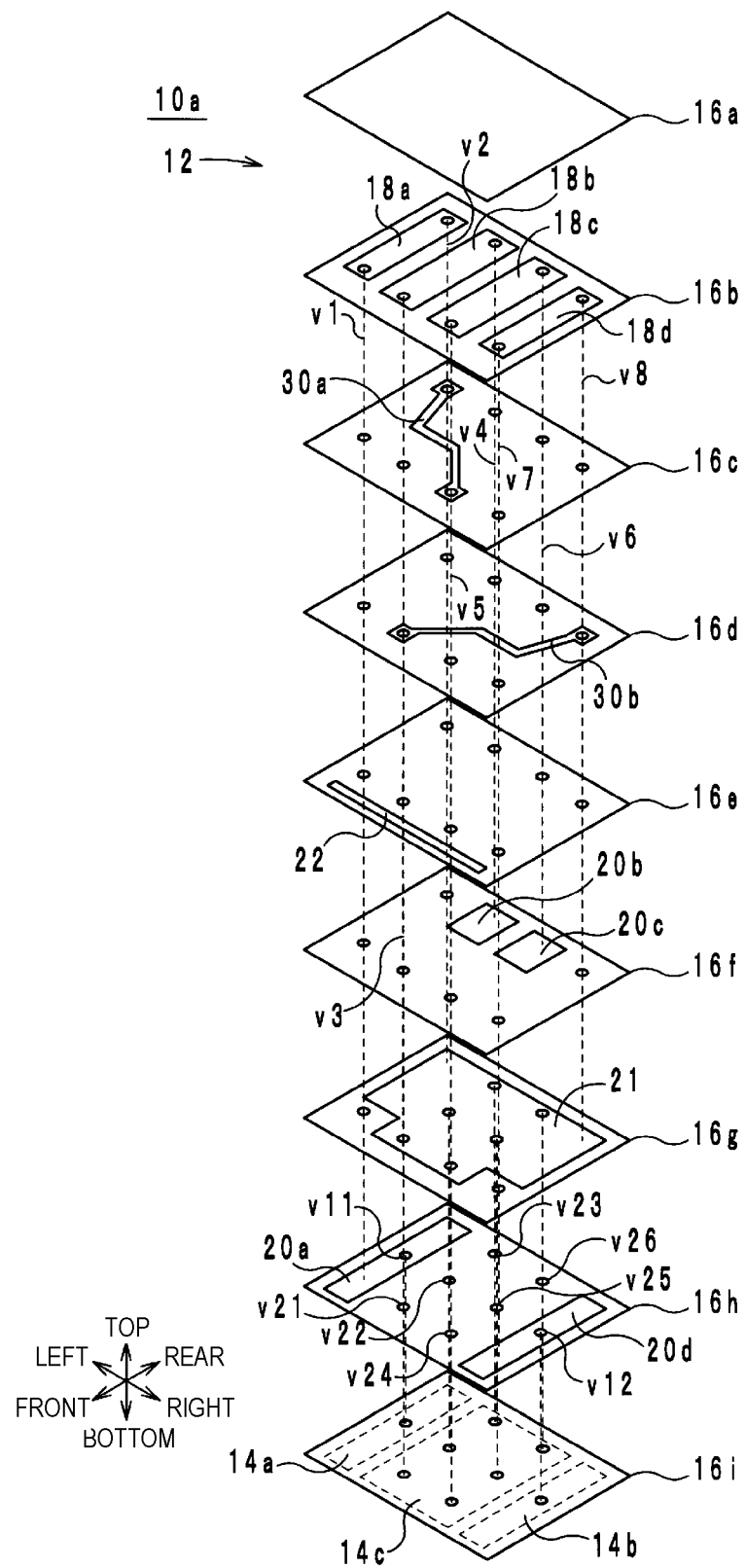
Figure 3B:
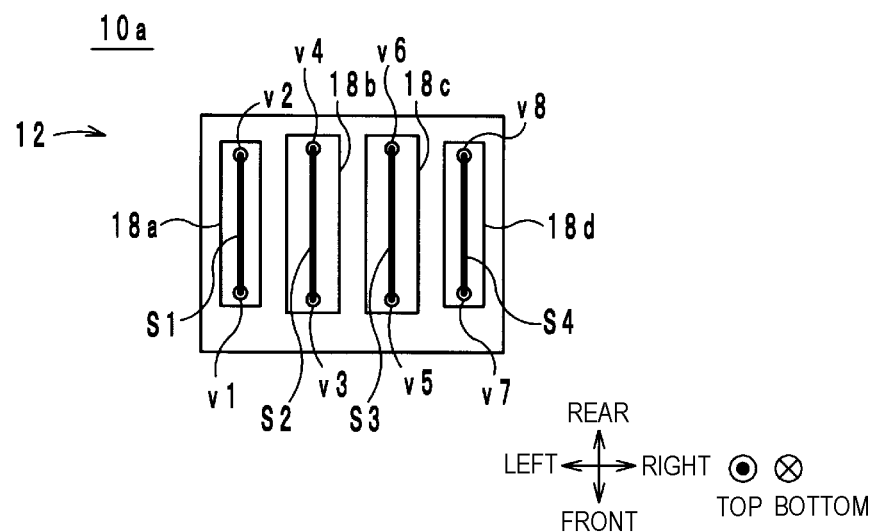
FIG. 3B is a see-through view of the electronic component 10a from above.

Next, the specific configuration of the electronic component 10a will be described with reference to the drawings. FIG. 2 is an external perspective view of the electronic component 10a. FIG. 3A is an exploded perspective view of the electronic component 10a. FIG. 3B is a see-through view of the electronic component 10a from above. FIG. 3B illustrates only a multilayer body 12, inductor conductor layers 18a to 18d, and via hole conductors v1 to v8. In the following, a lamination direction of the electronic component 10a is defined as a top-bottom direction (the bottom side is an example of one side in the lamination direction, and the top side is an example of another side in the lamination direction). Additionally, when the electronic component 10a is viewed in plan view from above, the direction in which a longer side of the electronic component 10a extends is defined as the left-right direction (an example of an orthogonal direction; the right side is an example of one side in the orthogonal direction, and the left side is an example of another side in the orthogonal direction), whereas the direction in which a shorter side of the electronic component 10a extends is defined as a front-rear direction. The top-bottom direction, the front-rear direction, and the left-right direction are orthogonal or substantially orthogonal to one another.

The electronic component 10a includes: the multilayer body 12; the outer electrodes 14a to 14c; the inductor conductor layers 18a to 18d; capacitor conductor layers 20a to 20d and 22; a ground conductor layer 21; connecting conductor layers 30a and 30b; and via hole conductors v1 to v8, v11, v12, and v21 to v26 (an example of interlayer connecting conductors).

The multilayer body 12 preferably has a substantially rectangular-parallelepiped shape, and preferably is formed by laminating insulation layers 16a to 16i so that the insulation layers are arranged in that order from top to bottom. When viewed in plan view from above, the insulation layers 16a to 16i preferably have substantially rectangular shapes, and preferably are formed from a ceramic material, etc., for example. Hereinafter, a main surface on the top side of the insulation layers 16a to 16i will be called a front surface, and a main surface on the bottom side of the insulation layers 16a to 16i will be called a rear surface.

The inductor conductor layers 18a to 18d are band-shaped conductor layers provided on the front surface of the insulation layer 16b, and extend in the front-rear direction of the insulation layer 16b.

The via hole conductor v1 (an example of a third interlayer connecting conductor) penetrates the insulation layers 16b to 16g in the top-bottom direction. A top end of the via hole conductor v1 is connected to a front end of the inductor conductor layer 18a. Thus, the via hole conductor v1 extends downward from the inductor conductor layer 18a.

The via hole conductor v2 (an example of a fourth interlayer connecting conductor) penetrates the insulation layers 16b to 16f in the top-bottom direction. A top end of the via hole conductor v2 is connected to a rear end of the inductor conductor layer 18a.

The inductor conductor layer 18a (an example of a second inductor conductor layer) and the via hole conductors v1 and v2 are included in the inductor L1. As a result, when viewed in plan view from the left, the inductor L1 has an angled U shape that is open downward.

The capacitor conductor layers 20a and 20d (an example of a second capacitor conductor layer) are band-shaped conductor layers provided on the front surface of the insulation layer 16h. The capacitor conductor layers 20a and 20d extend in the front-rear direction near the left and right shorter sides of the insulation layer 16h.

The ground conductor layer 21 (an example of a first ground conductor layer and a second ground conductor layer) is a substantially rectangular conductor layer provided on the front surface of the insulation layer 16g. The ground conductor layer 21 covers substantially the entire surface of the insulation layer 16g. Accordingly, the capacitor conductor layer 20a opposes the ground conductor layer 21 with the insulation layer 16g located therebetween. However, a right-front corner and a left-front corner are cut out from the ground conductor layer 21 to allow the via hole conductors v1 and v7 to pass.

The capacitor conductor layer 20a and the ground conductor layer 21 are included in the capacitor C1. Additionally, a bottom end of the via hole conductor v1 is connected to the capacitor conductor layer 20a. A bottom end of the via hole conductor v2 is connected to the ground conductor layer 21. The inductor L1 and the capacitor C1 thus define the LC parallel resonator LC1 by being connected to each other in parallel.

The via hole conductors v3 and v5 (an example of a second interlayer connecting conductor) penetrate the insulation layers 16b to 16i in the top-bottom direction. A top end of the via hole conductor v3 is connected to a front end of the inductor conductor layer 18b. A top end of the via hole conductor v5 is connected to a front end of the inductor conductor layer 18c.

The via hole conductors v4 and v6 (an example of a first interlayer connecting conductor) penetrate the insulation layers 16b to 16e in the top-bottom direction. A top end of the via hole conductor v4 is connected to a rear end of the inductor conductor layer 18b. A top end of the via hole conductor v6 is connected to a rear end of the inductor conductor layer 18c.

The inductor conductor layer 18b (an example of a first inductor conductor layer) and the via hole conductors v3 and v4 are included in the inductor L2. As a result, when viewed in plan view from the left, the inductor L2 has an angled U shape that is open downward. Likewise, the inductor conductor layer 18c (an example of the first inductor conductor layer) and the via hole conductors v5 and v6 are included in the inductor L3. As a result, when viewed in plan view from the left, the inductor L3 has an angled U shape that is open downward.

The capacitor conductor layers 20b and 20c (an example of a first capacitor conductor layer) are substantially rectangular conductor layers provided on the front surface of the insulation layer 16f. The capacitor conductor layers 20b and 20c are provided adjacent to the vicinity of the center of a rear-side longer side of the insulation layer 16f, and oppose the ground conductor layer 21 with the insulation layer 16f located therebetween.

The capacitor conductor layer 20b and the ground conductor layer 21 are included in the capacitor C2. Additionally, a bottom end of the via hole conductor v3 is connected to the ground conductor layer 21. A bottom end of the via hole conductor v4 is connected to the capacitor conductor layer 20b. The inductor L2 and the capacitor C2 thus define the LC parallel resonator LC2 by being connected to each other in parallel. The LC parallel resonator LC2 is located to the right of the LC parallel resonator LC1. The capacitor conductor layer 20 and the ground conductor layer 21 are included in the capacitor C3. Additionally, a bottom end of the via hole conductor v5 is connected to the ground conductor layer 21. A bottom end of the via hole conductor v6 is connected to the capacitor conductor layer 20c. The inductor L3 and the capacitor C3 thus define the LC parallel resonator LC3 by being connected to each other in parallel. The LC parallel resonator LC3 is located to the left of the LC parallel resonator LC4.

The via hole conductor v7 (an example of the third interlayer connecting conductor) penetrates the insulation layers 16b to 16g in the top-bottom direction. A top end of the via hole conductor v7 is connected to a front end of the inductor conductor layer 18d.

The via hole conductor v8 (an example of the fourth interlayer connecting conductor) penetrates the insulation layers 16b to 16f in the top-bottom direction. A top end of the via hole conductor v8 is connected to a rear end of the inductor conductor layer 18d. Thus, the via hole conductor v8 extends downward from the inductor conductor layer 18d.

The inductor conductor layer 18d (an example of the second inductor conductor layer) and the via hole conductors v7 and v8 are included in the inductor L4. As a result, when viewed in plan view from the left, the inductor L4 has an angled U shape that is open downward.

The capacitor conductor layer 20d and the ground conductor layer 21 are included in the capacitor C4. Additionally, a bottom end of the via hole conductor v7 is connected to the capacitor conductor layer 20d. A bottom end of the via hole conductor v8 is connected to the ground conductor layer 21. The inductor L4 and the capacitor C4 thus define the LC parallel resonator LC4 by being connected to each other in parallel.

As illustrated in FIG. 3B, the LC parallel resonators LC1 to LC4 define loop surfaces S1 to S4 surrounded by the inductors L1 to L4 and the capacitors C1 to C4, the loop surfaces S1 to S4 being parallel or substantially parallel with respect to the top-bottom direction. Each loop surface is a plane crossing through the left-right direction of the respective inductor conductor layers.

The via hole conductors v21 to v26 penetrate the insulation layers 16g to 16i in the top-bottom direction. Top ends of the via hole conductors v21 to v26 are connected to the ground conductor layer 21. Bottom ends of the via hole conductors v21 to v26 are connected to the outer electrode 14c. The LC parallel resonators LC1 to LC4 are connected to the outer electrode 14c as a result.

The LC parallel resonators LC1 to LC4 are arranged in that order from the left side to the right side.

Accordingly, adjacent ones of the loop surfaces S1 to S4 of the LC parallel resonators LC1 to LC4, with respect to the left-right direction, oppose each other. Specifically, the loop surface S1 (an example of a second loop surface) and the loop surface S2 (an example of a first loop surface) oppose each other. The loop surface S2 and the loop surface S3 (an example of the first loop surface) oppose each other. The loop surface S3 and the loop surface S4 (an example of a fourth loop surface) oppose each other. Accordingly, with the LC parallel resonators LC1 to LC4, resonators adjacent in the left-right direction magnetically couple with each other, and thus, the LC parallel resonators LC1 to LC4 define a band pass filter.

The capacitor conductor layer 22 is a band-shaped conductor layer provided on the front surface of the insulation layer 16e. The capacitor conductor layer 22 extends in the left-right direction near the front-side longer side of the insulation layer 16e. Thus, when viewed in plan view from above, the capacitor conductor layer 22 overlaps with front ends of the capacitor conductor layers 20a and 20d. Thus, the capacitor conductor layer 22 is interposed between the capacitor conductor layer 20a and the capacitor conductor layer 20d to define the capacitor C11. Note that the capacitor conductor layer 22 does not overlap with the inductor conductor layers 18a to 18d, the ground conductor layer 21, and so on when viewed in plan view.

The connecting conductor layer 30a (an example of a first connecting conductor) is a line-shaped conductor layer provided on the front surface of the insulation layer 16c. The connecting conductor layer 30a connects two inductors (LC parallel resonators) that are not adjacent in the left-right direction, namely the inductor L1 (the LC parallel resonator LC1) and the inductor L3 (the LC parallel resonator LC3). In other words, the connecting conductor layer 30a connects the inductor L1 (the LC parallel resonator LC1) that, of the inductors L1 and L4 (the LC parallel resonators LC1 and LC4), is located on the left side, and the inductor L3 (the LC parallel resonator LC3) that, of the inductors L2 and L3 (the LC parallel resonators LC2 and LC3), is located on the right side. A front end of the connecting conductor layer 30a is connected to the via hole conductor v5. A rear end of the connecting conductor layer 30a is connected to the via hole conductor v2. The connecting conductor layer 30a is included in the inductor L11.

The connecting conductor layer 30b (an example of a second connecting conductor) is a line-shaped conductor layer provided on the front surface of the insulation layer 16d. The connecting conductor layer 30b connects two inductors (LC parallel resonators) that are not adjacent in the left-right direction, namely the inductor L2 (the LC parallel resonator LC2) and the inductor L4 (the LC parallel resonator LC4). In other words, the connecting conductor layer 30b connects the inductor L4 (the LC parallel resonator LC4) that, of the inductors L1 and L4 (the LC parallel resonators LC1 and LC4), is located on the right side, and the inductor L2 (the LC parallel resonator LC2) that, of the inductors L2 and L3 (the LC parallel resonators LC2 and LC3), is located on the left side. A front end of the connecting conductor layer 30b is connected to the via hole conductor v3. A rear end of the connecting conductor layer 30b is connected to the via hole conductor v8. The connecting conductor layer 30b is included in the inductor L12.

When viewed in plan view from above, the connecting conductor layer 30a and the connecting conductor layer 30b intersect. As a result, the connecting conductor layer 30a and the connecting conductor layer 30b magnetically couple.

Figure 4:
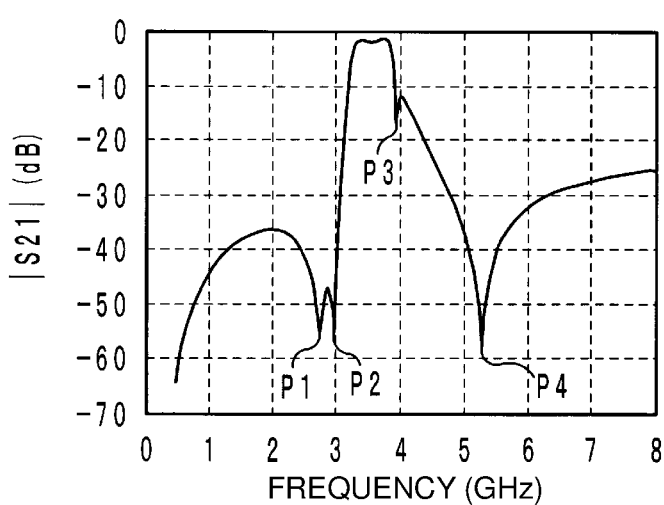
FIG. 4 is a graph illustrating bandpass characteristics (S21) of a first model.
Figure 5:
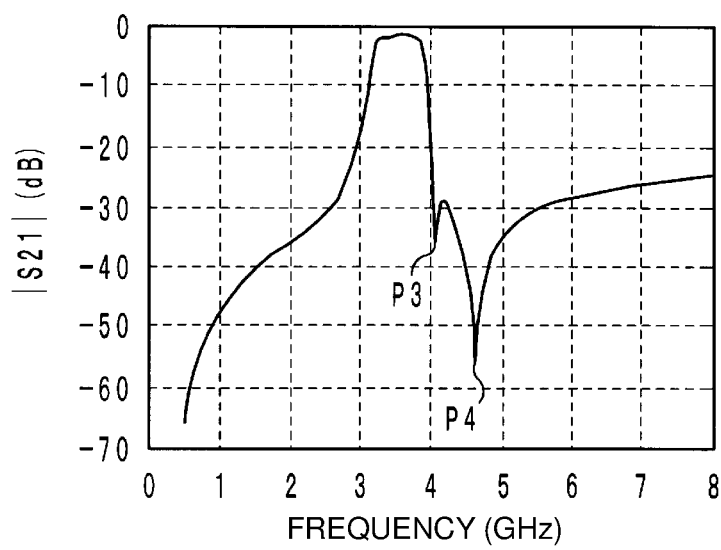
FIG. 5 is a graph illustrating bandpass characteristics (S21) of a second model.
Figure 6:
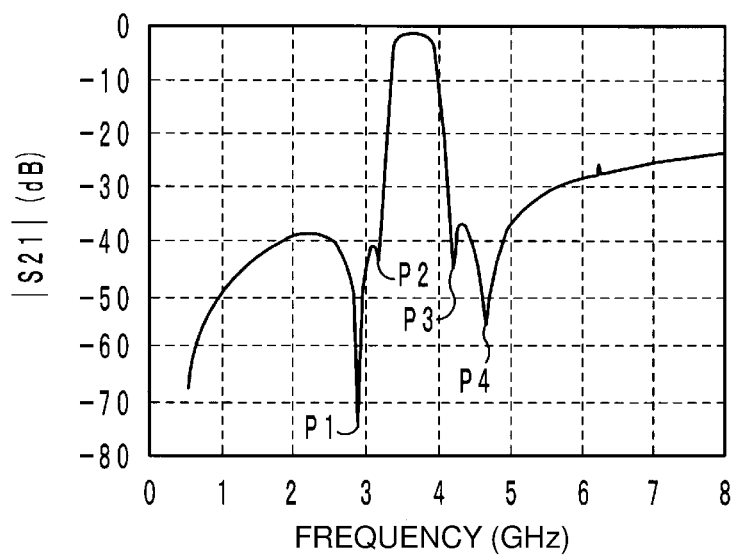
FIG. 6 is a graph illustrating bandpass characteristics (S21) of a third model.

According to the electronic component 10a of the present preferred embodiment, desired bandpass characteristics are achieved easily. This will be described below with reference to the drawings. FIG. 4 is a graph illustrating bandpass characteristics (S21) of a first model. FIG. 5 is a graph illustrating bandpass characteristics (S21) of a second model. FIG. 6 is a graph illustrating bandpass characteristics (S21) of a third model. In FIGS. 4 to 6, the vertical axis represents |S21|, and the horizontal axis represents a frequency. "S21" represents the value of a ratio of the strength of a high-frequency signal outputted from the outer electrode 14b relative to the strength of a high-frequency signal inputted from the outer electrode 14a.

The inventors created the first to third models described below and calculated the bandpass characteristics of the models through computer simulations. The first model is a model in which the connecting conductor layers 30a and 30b are omitted from the electronic component 10a, and a line width of the capacitor conductor layer 22 is increased or the capacitor conductor layer 22 is positioned on a lower side in the electronic component 10a. The second model is a model in which the connecting conductor layers 30a and 30b are omitted from the electronic component 10a. The third model is a model of the electronic component 10a. The line width of the capacitor conductor layer 22 in the second model and the line width of the capacitor conductor layer 22 in the third model are the same. The first model and the second model correspond to models according to comparative examples.

The bandpass characteristics of the first model are the characteristics indicated in FIG. 4. In the bandpass characteristics of the first model, attenuation poles P1 and P2 are provided at frequencies lower than a pass band, and attenuation poles P3 and P4 are provided at frequencies higher than the pass band. In this first model, there is a desire to increase the attenuation at the attenuation poles P1 to P4 to obtain bandpass characteristics that rise and fall sharply on both ends of the pass band.

Accordingly, making the line width of the capacitor conductor layer 22 in the second model narrower than the line width of the capacitor conductor layer 22 in the first model, or positioning the capacitor conductor layer 22 on a lower side, can be considered. Doing so reduces a capacitance value of the capacitor C11. As a result, as illustrated in FIG. 5, the attenuation at the attenuation pole P3 increases, and the bandpass characteristics fall sharply on the high-frequency side of the pass band.

However, when the capacitance value of the capacitor C11 drops, the attenuation pole P1 and the attenuation pole P2 become closer, as illustrated in FIG. 5. As a result, the attenuation poles P1 and P2 disappear, resulting in a softer waveform. Thus, the bandpass characteristics no longer rise sharply on the low-frequency side of the pass band.

Accordingly, in the third model, the connecting conductor layers 30a and 30b are provided. Thus, the LC parallel resonator LC1 and the LC parallel resonator LC3 magnetically couple, and the LC parallel resonator LC2 and the LC parallel resonator LC4 magnetically couple. As a result, the attenuation pole P1 and the attenuation pole P2 are distanced from each other, which causes the attenuation poles P1 and P2 to appear, without the positional relationship between the attenuation pole P3 and the attenuation pole P4 changing. Furthermore, the attenuation at the attenuation pole P1 in the third model is greater than the attenuation at the attenuation poles P1 and P2 in the first model. In other words, in the third model, bandpass characteristics that rise and fall sharply on both ends of the pass band are obtained.

As described thus far, by adjusting the capacitance value of the capacitor C11 and also providing the connecting conductor layers 30a and 30b, the attenuations and frequencies of the attenuation poles P1 to P4 provided at both ends of the pass band are able to be adjusted. Thus, according to the electronic component 10a, the desired bandpass characteristics are achieved easily.

Additionally, according to the electronic component 10a, the connecting conductor layers 30a and 30b overlap with each other when viewed in plan view from above. This makes it easy for the connecting conductor layers 30a and 30b to magnetically couple and electrically couple. Thus, by adjusting the surface area over which the connecting conductor layer 30a and the connecting conductor layer 30b overlap, the magnetic coupling and the electrical coupling are able to be adjusted. The bandpass characteristics of the electronic component 10a are able to be adjusted as a result.

Second Preferred Embodiment

Figure 7:
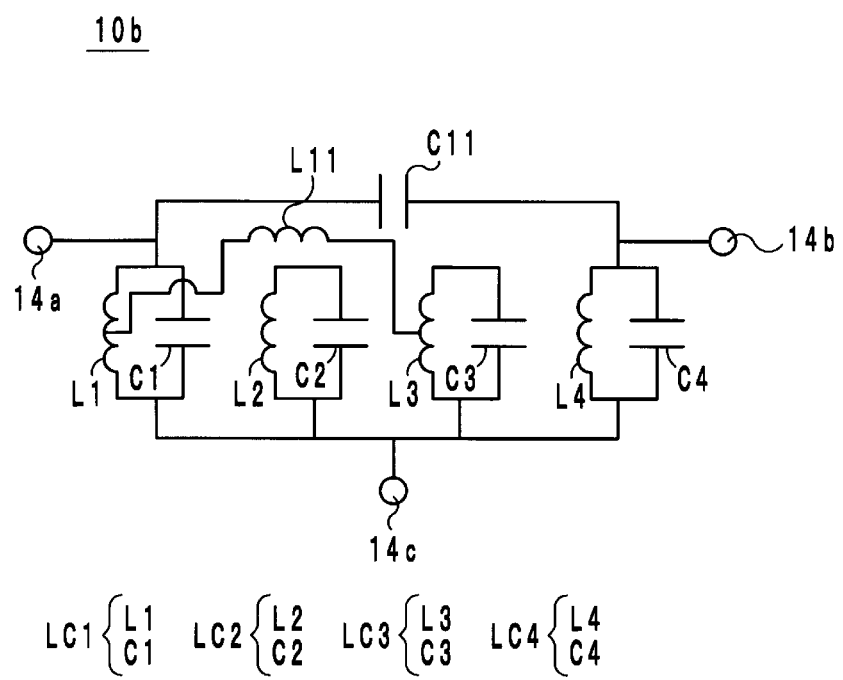
FIG. 7 is an equivalent circuit diagram illustrating the electronic component 10b according to a second preferred embodiment of the present invention.
Figure 8:
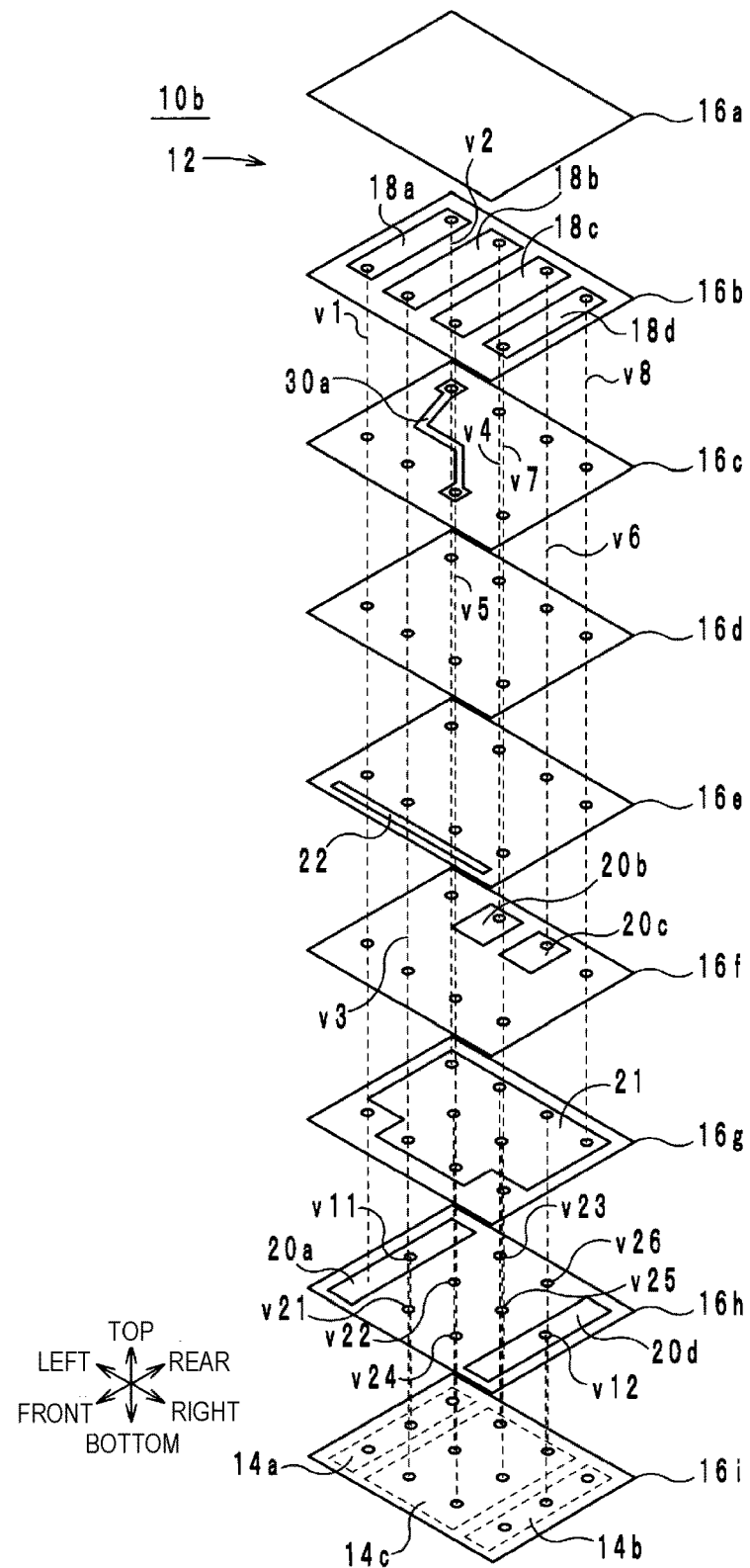
FIG. 8 is an exploded perspective view of the electronic component 10b.

An electronic component according to a second preferred embodiment of the present invention will be described hereinafter with reference to the drawings. FIG. 7 is an equivalent circuit diagram illustrating an electronic component 10b according to the second preferred embodiment. FIG. 8 is an exploded perspective view of the electronic component 10b.

As illustrated in FIGS. 7 and 8, the electronic component 10b differs from the electronic component 10a in that the inductor L12 (the connecting conductor layer 30b) is not provided. Thus, in this manner, it is also possible to provide only one of the inductor L11 (the connecting conductor layer 30a) and the inductor L12 (the connecting conductor layer 30b).

The electronic component 10b provides the same effects as those of the electronic component 10a.

Third Preferred Embodiment

Figure 9:
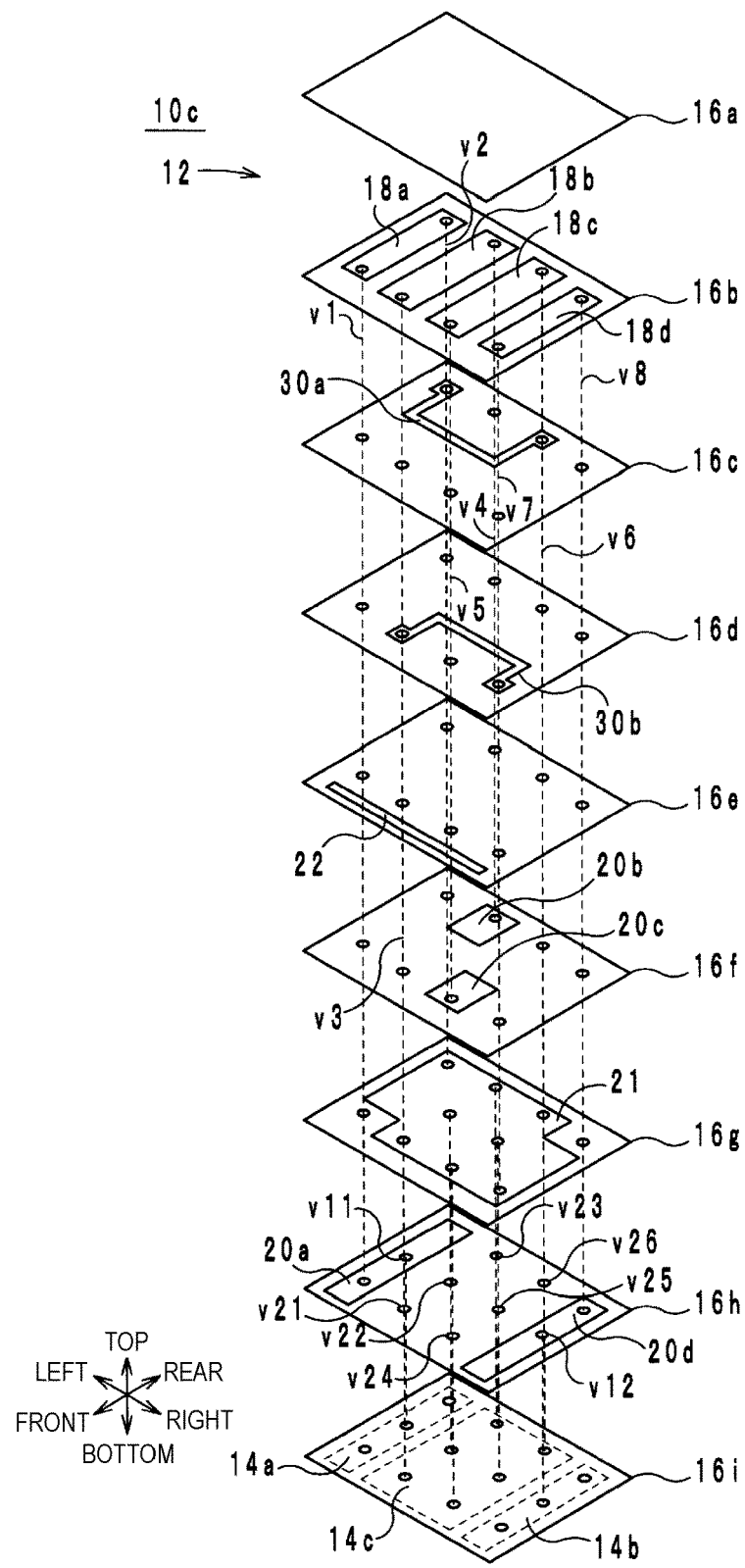
FIG. 9 is an exploded perspective view of the electronic component 10c.

An electronic component according to a third preferred embodiment of the present invention will be described hereinafter with reference to the drawings. FIG. 9 is an exploded perspective view of an electronic component 10c.

As illustrated in FIG. 9, the electronic component 10c differs from the electronic component 10a in that the connecting conductor layer 30a and the connecting conductor layer 30b do not intersect when viewed in plan view from above, and in terms of the direction of the LC parallel resonator LC3. Thus, in this manner, the connecting conductor layers 30a and 30b are able to be provided so as not to intersect in the case where the connecting conductor layer 30a and the connecting conductor layer 30b are not to strongly magnetically couple and electrically couple.

The electronic component 10c provides the same effects as those of the electronic component 10a.

Fourth Preferred Embodiment

Figure 10:
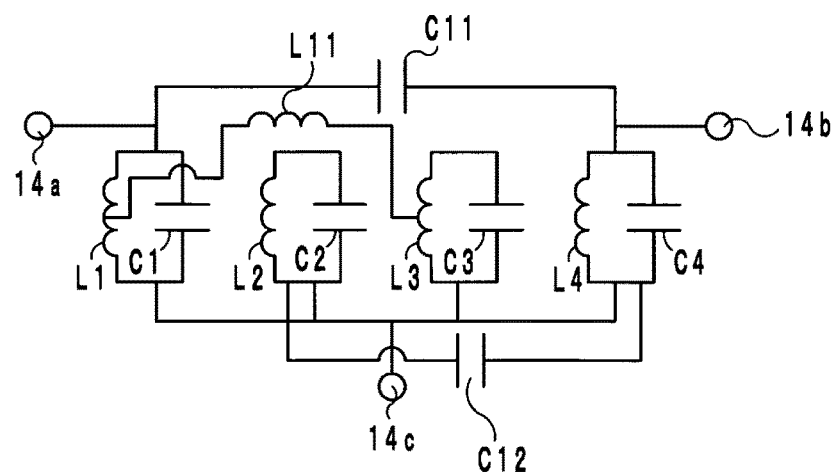
FIG. 10 is an equivalent circuit diagram illustrating the electronic component 10d.

An electronic component according to a fourth preferred embodiment of the present invention will be described hereinafter with reference to the drawings. FIG. 10 is an equivalent circuit diagram illustrating an electronic component 10d.

As illustrated in FIG. 10, the electronic component 10d differs from the electronic component 10a in that a capacitor C12 is provided instead of the inductor L12.

The electronic component 10d provides the same effects as those of the electronic component 10a.

Fifth Preferred Embodiment

Figure 11:
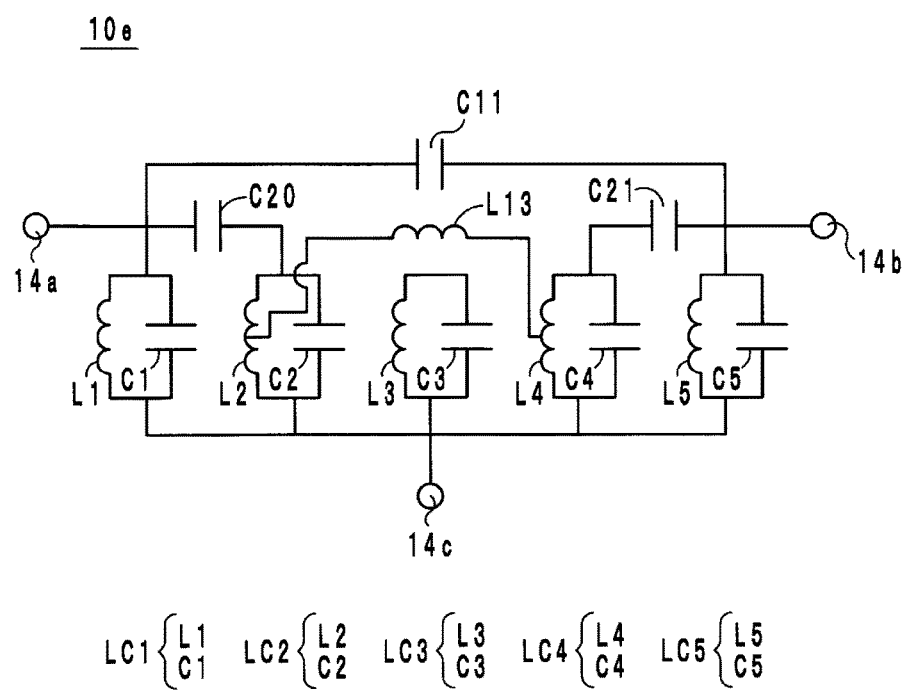
FIG. 11 is an equivalent circuit diagram illustrating the electronic component 10e.

An electronic component according to a fifth preferred embodiment of the present invention will be described hereinafter with reference to the drawings. FIG. 11 is an equivalent circuit diagram illustrating an electronic component 10e.

As illustrated in FIG. 11, the electronic component 10e differs from the electronic component 10a in that LC parallel resonators LC1 to LC5 are provided. Thus, in this manner, the electronic component 10e may include five LC parallel resonators.

Additionally, in the electronic component 10e, an inductor L13 connects the two LC parallel resonators, that is, the LC parallel resonator LC2 and the LC parallel resonator LC4 that are not adjacent in the left-right direction.

The electronic component 10e provides the same effects as those of the electronic component 10a.

Note that in the electronic component 10e, it is sufficient that the inductor L13 connects any two LC parallel resonators that are not adjacent in the left-right direction, for example. Accordingly, the inductor L13 may connect the LC parallel resonator LC1 and the LC parallel resonator LC3, or may connect the LC parallel resonator LC1 and the LC parallel resonator LC4. Alternatively, the inductor L13 may connect the LC parallel resonator LC2 and the LC parallel resonator LC5, or may connect the LC parallel resonator LC3 and the LC parallel resonator LC5.

Accordingly, it is sufficient that the inductor L13 connects any two of the LC parallel resonators LC2 to LC4 that are not adjacent to each other in the left-right direction, or connects any two of the LC parallel resonators LC1 to LC5 that are not adjacent in the left-right direction, namely one of the LC parallel resonators LC1 and LC5 and one of the LC parallel resonators LC2 to LC4. However, the inductor L13 must not connect the LC parallel resonator LC1 and the LC parallel resonator LC5 that are located on both ends.

Other Preferred Embodiments

The electronic components according to preferred embodiments of the present invention are not limited to the above-described electronic components 10a to 10e, and can be modified without departing from the essential spirit thereof.

The configurations of the electronic components 10a to 10e may be combined as desired.

Note also that the loop surfaces S1 to S4 need not be parallel to each other.

As described above, preferred embodiments of the present invention are useful in electronic components, and are particularly advantageous in that desired bandpass characteristics are achieved easily.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a multilayer body including a plurality of insulation layers laminated in a lamination direction;
   two first LC parallel resonators arranged in an orthogonal direction orthogonal or substantially orthogonal to the lamination direction, each of the two first LC parallel resonators including a first inductor and a first capacitor;
   two second LC parallel resonators disposed so as to enclose the two first LC parallel resonators from two sides in the orthogonal direction, each of the two second LC parallel resonators including a second inductor and a second capacitor;
   a coupling capacitor connected to one end of the two second LC parallel resonators; and
   a first connecting conductor that connects one of the two first LC parallel resonators and one of the two second LC parallel resonators that are not adjacent in the orthogonal direction, the one of the two first LC parallel resonators is located on one side in the orthogonal direction and the one of the two second LC parallel resonators is located on another side in the orthogonal direction; and
   a second connecting conductor that connects another one of the two first LC parallel resonators that is located on the another side in the orthogonal direction to another one of the two second LC parallel resonators that is located on the one side in the orthogonal direction; wherein
   resonators of the two first LC parallel resonators and the two second LC parallel resonators adjacent in the orthogonal direction magnetically couple with each other to define a band pass filter.

2. The electronic component according to claim 1, wherein the first and second connecting conductors do not intersect with each other as viewed in a plan view from above.

3. The electronic component according to claim 1, wherein
   the first connecting conductor and the second connecting conductor are conductor layers provided on at least one of the plurality of insulation layers; and
   the first connecting conductor and the second connecting conductor intersect when viewed in a plan view from the lamination direction.

4. The electronic component according to claim 1, wherein the first connecting conductor and the second connecting conductor are conductor layers provided on at least one of the plurality of insulation layers; and the first connecting conductor and the second connecting conductor do not intersect when viewed in a plan view from the lamination direction.

5. The electronic component according to claim 1, wherein the first and second connecting conductors overlap at least partially.

6. The electronic component according to claim 1, wherein at least one of the first inductor and the second inductor has an angled U shape opening downward.

7. The electronic component according to claim 1, wherein the multilayer body has a substantially rectangular-parallelepiped shape.

8. The electronic component according to claim 1, wherein the multilayer body includes via hole conductors to provide electrical connections.

9. An electronic component comprising:
a multilayer body including a plurality of insulation layers laminated in a lamination direction;
two or more first LC parallel resonators arranged in an orthogonal direction orthogonal or substantially orthogonal to the lamination direction, each of the two or more first LC parallel resonators including a first inductor and a first capacitor;
two second LC parallel resonators disposed so as to enclose the two or more first LC parallel resonators from two sides in the orthogonal direction, each of the two second LC parallel resonators including a second inductor and a second capacitor;
a coupling capacitor connected to one end of the two second LC parallel resonators; and
a first connecting conductor that connects two of the first LC parallel resonators that are not adjacent in the orthogonal direction, or connects one of the first LC parallel resonators and one of the second LC parallel resonators that are not adjacent in the orthogonal direction; wherein
resonators of the two or more first LC parallel resonators and the two second LC parallel resonators adjacent in the orthogonal direction magnetically couple with each other to define a band pass filter;
each of the two or more first LC parallel resonators defines a first loop surface surrounded by the first inductor and the first capacitor, the first loop surface being parallel or substantially parallel to the lamination direction;
each of the two second LC parallel resonators defines a second loop surface surrounded by the second inductor and the second capacitor, the second loop surface being parallel or substantially parallel to the lamination direction;
the first inductor of each of the two or more first LC parallel resonators includes a first interlayer connecting conductor and a second interlayer connecting conductor that penetrate the plurality of insulation layers in the lamination direction, and a first inductor conductor layer provided on one of the plurality of insulation layers;
the first interlayer connecting conductor and the second interlayer connecting conductor extend from the first inductor conductor layer toward one side in the lamination direction;
the second inductor of each of the two second LC parallel resonators includes a third interlayer connecting conductor and a fourth interlayer connecting conductor that penetrate the plurality of insulation layers in the lamination direction, and a second inductor conductor layer provided on one of the plurality of insulation layers;
the third interlayer connecting conductor and the fourth interlayer connecting conductor extend from the second inductor conductor layer toward the one side in the lamination direction;
the first capacitor of each of the two or more first LC parallel resonators includes a first capacitor conductor layer and a first ground conductor layer that oppose each other with at least one of the plurality of insulation layers located therebetween;
the second capacitor of each of the two second LC parallel resonators includes a second capacitor conductor layer and a second ground conductor layer that oppose each other with at least one of the plurality of insulation layers located therebetween;
the first interlayer connecting conductor is connected to the first capacitor conductor layer;
the second interlayer connecting conductor is connected to the first ground conductor layer;
the third interlayer connecting conductor is connected to the second capacitor conductor layer; and
the fourth interlayer connecting conductor is connected to the second ground conductor layer.

10. The electronic component according to claim 9, wherein each of the first interlayer connecting conductor, the second interlayer connecting conductor, and the third interlayer connecting conductor includes a via hole conductor.

11. The electronic component according to claim 9, wherein surfaces of two or more of the first loop surfaces and two of the second loop surfaces adjacent in the orthogonal direction oppose each other.

12. The electronic component according to claim 9, wherein the multilayer body includes five parallel resonators.

13. The electronic component according to claim 9, wherein the first and second capacitor conductor layers overlap at least partially.

14. The electronic component according to claim 9, wherein the first connecting conductor is the only connecting conductor in the multilayer body that connects two of the first LC parallel resonators and/or the second LC parallel resonators to one another.

15. An electronic component comprising:
a multilayer body including a plurality of insulation layers laminated in a lamination direction;
two or more first LC parallel resonators arranged in an orthogonal direction orthogonal or substantially orthogonal to the lamination direction, each of the two or more first LC parallel resonators including a first inductor and a first capacitor;
two second LC parallel resonators disposed so as to enclose the two or more first LC parallel resonators from two sides in the orthogonal direction, each of the two second LC parallel resonators including a second inductor and a second capacitor;
a coupling capacitor connected to one end of the two second LC parallel resonators; and
a first connecting conductor that connects two of the first LC parallel resonators that are not adjacent in the orthogonal direction, or connects one of the first LC parallel resonators and one of the second LC parallel resonators that are not adjacent in the orthogonal direction; wherein
resonators of the two or more first LC parallel resonators and the two second LC parallel resonators adjacent in the orthogonal direction magnetically couple with each other to define a band pass filter;
each of the first LC parallel resonators defines a first loop surface surrounded by the first inductor and the first capacitor;
each of the second LC parallel resonators defines a second loop surface surrounded by the second inductor and the second capacitor; and
the first and second loop surfaces are not parallel to each other.

* * * * *